United States Patent
Lee et al.

(10) Patent No.: US 6,852,558 B2
(45) Date of Patent: Feb. 8, 2005

(54) METHODS FOR FORMING INDEX GUIDED VERTICAL CAVITY SURFACE EMITTING LASERS

(75) Inventors: Hsing-Chung Lee, Calabasas, CA (US); Liew-Chuang Chui, Singapore (MY)

(73) Assignee: JDS Uniphase Corporation, San Jose, CA (US)

(*) Notice: Subject to any disclaimer, the term of this patent is extended or adjusted under 35 U.S.C. 154(b) by 156 days.

(21) Appl. No.: 10/339,057

(22) Filed: Jan. 7, 2003

(65) Prior Publication Data

US 2003/0096439 A1 May 22, 2003

Related U.S. Application Data

(62) Division of application No. 09/400,359, filed on Sep. 20, 1999, now Pat. No. 6,577,658.

(51) Int. Cl.[7] .............................................. H01L 21/00
(52) U.S. Cl. .............................. 438/32; 438/29; 438/39; 372/45
(58) Field of Search .............................. 438/29, 32, 42, 438/47; 372/45, 46, 50

(56) References Cited

U.S. PATENT DOCUMENTS

| | | | |
|---|---|---|---|
| 3,506,275 | A | 4/1970 | Kressel et al. |
| 3,878,105 | A | 4/1975 | Palmer |
| 3,974,514 | A | 8/1976 | Kressel et al. |
| 3,978,428 | A | 8/1976 | Burnham et al. |
| 4,033,796 | A | 7/1977 | Burnham et al. |
| 4,110,661 | A | 8/1978 | Harris, Jr. et al. |

(List continued on next page.)

FOREIGN PATENT DOCUMENTS

| | | |
|---|---|---|
| EP | 0 334 637 A2 | 9/1989 |
| EP | 0 473 983 A2 | 3/1992 |
| GB | 2 293 919 A | 4/1996 |

OTHER PUBLICATIONS

B. Tell, K.F. Brown–Goebeler, R.E. Leibengeth, F.M. Baez & Y.H. Lee; Temperature dependence of GaAs–AlGaAs vertical cavity surface emitting lasers; Appl. Phys. Lett. 60 (6), Feb. 10, 1992.

B. Tell, K.F. Brown–Goebeler, & R.E. Leibengeth; Thermal Characteristics of Deep Red (1.77um) vertical–cavity surface–emitting lasers; IEEE Photonics Technology Letters, vol. 4., No. 6; Jun. 1992.

S. Jiang, M. Dagenais and R. Morgan; Multimode Behavior of a Vertical–Cavity Surface–Emitting Laser with Feedback from an External Reflecting Surface; Digest of LEOS Annual Meeting, Piscataway, NJ, 1994 pp. 274–275, IEEE Document NO. IPD–P94–044.

Yang, et al., Low–threshold operation of a GaAs Single Quantum Well Mushroom Structure Surface–Emitting Laser, Appl. Phys. Lett., pp. 1780–1782, vol. 58(16), Apr. 22, 1991.

Geels, et al., Submilliamp Threshold Vertical–Cavity Diodes, Appl. Phys. Lett. 57(16), pp. 1605–1607, Oct. 15, 1990.

(List continued on next page.)

Primary Examiner—Amir Zarabian
Assistant Examiner—Khanh Duong
(74) Attorney, Agent, or Firm—Allen, Dyer, Doppelt, Milbrath & Gilchrist, P.A.

(57) ABSTRACT

Planar index guided vertical cavity surface emitting laser (PIG VCSEL) utilizes index guiding to provide improved optical confinement and proton implantation to improve current confinement. Index guiding is achieved by etching index guide openings (holes or partial ridges) around the optical confinement region and may be adjusted by varying the etched volume of the index guide openings (holes and partial ridges). The top contact surface area is increased in the PIG VCSEL thereby lowering contact and device resistance to improve VCSEL performance further. The PIG VCSEL is a substantially planarized device for ease of manufacture.

28 Claims, 8 Drawing Sheets

U.S. PATENT DOCUMENTS

| | | |
|---|---|---|
| 4,249,967 A | 2/1981 | Liu et al. |
| 4,309,670 A | 1/1982 | Burnham et al. |
| 4,347,611 A | 8/1982 | Scifres et al. |
| 4,376,946 A | 3/1983 | Kaminow et al. |
| 4,573,163 A | 2/1986 | Kaminow |
| 4,633,476 A | 12/1986 | Scifres et al. |
| 4,636,821 A | 1/1987 | Yanase et al. |
| 4,675,875 A | 6/1987 | Takamiya |
| 4,694,549 A | 9/1987 | Rabe |
| 4,730,326 A | 3/1988 | Taneya et al. |
| 4,740,481 A | 4/1988 | Wilson et al. |
| 4,745,462 A | 5/1988 | Dischert et al. |
| 4,757,509 A | 7/1988 | Isshiki et al. |
| 4,764,936 A | 8/1988 | Taneya et al. |
| 4,766,470 A | 8/1988 | Scholl et al. |
| 4,772,082 A | 9/1988 | Matsui et al. |
| 4,819,048 A | 4/1989 | Mand et al. |
| 4,847,844 A | 7/1989 | Noda et al. |
| 4,852,110 A | 7/1989 | Fujii et al. |
| 4,853,936 A | 8/1989 | Matsui et al. |
| 4,856,014 A | 8/1989 | Figueroa et al. |
| 4,856,017 A | 8/1989 | Ungar |
| 4,942,585 A | 7/1990 | Ungar |
| 4,943,970 A | 7/1990 | Bradley |
| 4,949,350 A | 8/1990 | Jewell et al. |
| 4,949,351 A | 8/1990 | Imanaka |
| 4,958,202 A | 9/1990 | Kinoshita et al. |
| 4,967,241 A | 10/1990 | Kinoshita et al. |
| 4,974,036 A | 11/1990 | Kapon |
| 4,982,409 A | 1/1991 | Kinoshita et al. |
| 4,990,466 A | 2/1991 | Shieh et al. |
| 4,991,179 A | 2/1991 | Deppe et al. |
| 5,018,157 A | 5/1991 | Deppe et al. |
| 5,029,175 A | 7/1991 | Ohnaka et al. |
| 5,033,053 A | 7/1991 | Shimizu et al. |
| 5,033,054 A | 7/1991 | Scifres et al. |
| 5,034,958 A | 7/1991 | Kwon et al. |
| 5,038,356 A | 8/1991 | Botez et al. |
| 5,040,032 A | 8/1991 | Kapon |
| 5,043,775 A | 8/1991 | Lee |
| 5,045,498 A | 9/1991 | Wang et al. |
| 5,050,155 A | 9/1991 | Kurata et al. |
| 5,063,569 A | 11/1991 | Xie |
| 5,068,868 A | 11/1991 | Deppe et al. |
| 5,088,099 A | 2/1992 | Chen et al. |
| 5,115,441 A | 5/1992 | Kopf et al. |
| 5,115,442 A | 5/1992 | Lee et al. |
| 5,128,955 A | 7/1992 | Danielmeyer |
| 5,132,982 A | 7/1992 | Chan et al. |
| 5,136,603 A | 8/1992 | Hasnain et al. |
| 5,143,863 A | 9/1992 | Ohnaka et al. |
| 5,148,267 A | 9/1992 | Ty Tan et al. |
| 5,155,560 A | 10/1992 | Sheperd |
| 5,159,603 A | 10/1992 | Kim |
| 5,160,492 A | 11/1992 | Wang et al. |
| 5,164,329 A | 11/1992 | Moyer et al. |
| 5,206,871 A | 4/1993 | Deppe et al. |
| 5,216,686 A | 6/1993 | Holm et al. |
| 5,223,204 A | 6/1993 | Endoh |
| 5,231,642 A | 7/1993 | Scifres et al. |
| 5,237,581 A | 8/1993 | Asada et al. |
| 5,239,189 A | 8/1993 | Lawrence |
| 5,245,622 A | 9/1993 | Jewell et al. |
| 5,247,167 A | 9/1993 | Bargerhuff et al. |
| 5,249,245 A | 9/1993 | Lebby et al. |
| 5,255,278 A | 10/1993 | Yamanaka |
| 5,256,596 A | 10/1993 | Ackley et al. |
| 5,258,316 A | 11/1993 | Ackley et al. |
| 5,258,990 A | 11/1993 | Olbright et al. |
| 5,266,503 A | 11/1993 | Wang et al. |
| 5,272,375 A | 12/1993 | Belopolsky |
| 5,274,655 A | 12/1993 | Shieh et al. |
| 5,285,466 A | 2/1994 | Tabatabaie |
| 5,289,018 A | 2/1994 | Okuda et al. |
| 5,293,392 A | 3/1994 | Shieh et al. |
| 5,301,201 A | 4/1994 | Dutta et al. |
| 5,311,533 A | 5/1994 | Stutius et al. |
| 5,317,587 A | 5/1994 | Ackley et al. |
| 5,328,854 A | 7/1994 | Vakhshoori et al. |
| 5,331,654 A | 7/1994 | Jewell et al. |
| 5,341,002 A | 8/1994 | Plumb |
| 5,343,487 A | 8/1994 | Scott et al. |
| 5,345,468 A | 9/1994 | Choquette |
| 5,351,257 A | 9/1994 | Lebby et al. |
| 5,357,591 A | 10/1994 | Jiang et al. |
| 5,359,447 A | 10/1994 | Hahn et al. |
| 5,359,618 A | 10/1994 | Lebby et al. |
| 5,363,393 A | 11/1994 | Uomi et al. |
| 5,379,312 A | 1/1995 | Bour et al. |
| 5,387,543 A | 2/1995 | Ackley |
| 5,388,120 A | 2/1995 | Ackley et al. |
| 5,397,739 A | 3/1995 | Chalmers et al. |
| 5,397,917 A | 3/1995 | Ommen et al. |
| 5,399,885 A | 3/1995 | Thijs et al. |
| 5,400,356 A | 3/1995 | Bringans et al. |
| 5,403,774 A | 4/1995 | Shieh et al. |
| 5,412,680 A | 5/1995 | Swirhun et al. |
| 5,416,044 A | 5/1995 | Chino et al. |
| 5,420,880 A | 5/1995 | Tabatabaie et al. |
| 5,422,901 A | 6/1995 | Lebby et al. |
| 5,426,657 A | 6/1995 | Vakhshoori |
| 5,436,192 A | 7/1995 | Epler et al. |
| 5,438,586 A | 8/1995 | Ishii et al. |
| 5,442,203 A | 8/1995 | Adomi et al. |
| 5,448,536 A | 9/1995 | Muranishi et al. |
| 5,457,328 A | 10/1995 | Ishimatsu et al. |
| 5,465,266 A | 11/1995 | Bour et al. |
| 5,468,656 A | 11/1995 | Shieh et al. |
| 5,475,701 A | 12/1995 | Hibbs-Brenner |
| 5,485,014 A | 1/1996 | Jain et al. |
| 5,491,712 A | 2/1996 | Lin et al. |
| 5,493,577 A | 2/1996 | Choquette et al. |
| 5,513,204 A | 4/1996 | Jayaraman |
| 5,530,715 A | 6/1996 | Shieh et al. |
| 5,554,061 A | 9/1996 | Park et al. |
| 5,568,499 A | 10/1996 | Lear |
| 5,568,504 A | 10/1996 | Kock et al. |
| 5,574,743 A | 11/1996 | van der Poel et al. |
| 5,577,064 A | 11/1996 | Swirhun et al. |
| 5,596,595 A | 1/1997 | Tan et al. |
| 5,606,572 A | 2/1997 | Swirhun et al. |
| 5,638,392 A | 6/1997 | Ramdani et al. |
| 5,657,339 A | 8/1997 | Fukunaga |
| 5,671,243 A | 9/1997 | Yap |
| 5,696,784 A | 12/1997 | Srinivasan et al. |
| 5,706,306 A | 1/1998 | Jiang et al. |
| 5,708,669 A | 1/1998 | DiGiovanni et al. |
| 5,708,674 A | 1/1998 | Beernink et al. |
| 5,712,865 A | 1/1998 | Chow et al. |
| 5,717,707 A | 2/1998 | Beernink et al. |
| 5,719,893 A | 2/1998 | Jiang et al. |
| 5,719,894 A | 2/1998 | Jewell et al. |
| 5,732,099 A | 3/1998 | Kawasumi et al. |
| 5,732,103 A | 3/1998 | Ramdani et al. |
| 5,764,676 A | 6/1998 | Paoli et al. |
| 5,766,981 A | 6/1998 | Thornton et al. |
| 5,784,398 A | 7/1998 | Amann et al. |
| 5,796,769 A | 8/1998 | Ramdani et al. |
| 5,796,771 A | 8/1998 | DenBaars et al. |
| 5,812,576 A | 9/1998 | Bour |
| 5,812,578 A | 9/1998 | Schemmann et al. |

| | | |
|---|---|---|
| 5,815,524 A | 9/1998 | Ramdani et al. |
| 5,825,796 A | 10/1998 | Jewell et al. |
| 5,831,960 A | 11/1998 | Jiang et al. |
| 5,832,017 A | 11/1998 | Ramdani et al. |
| 5,832,019 A | 11/1998 | Paoli et al. |
| 5,838,707 A | 11/1998 | Ramdani et al. |
| 5,848,086 A | 12/1998 | Lebby et al. |
| 5,877,519 A | 3/1999 | Jewell |
| 5,883,918 A | 3/1999 | Gubb et al. |
| 5,896,408 A | 4/1999 | Corzine et al. |
| 5,898,722 A | 4/1999 | Ramdani et al. |
| 5,903,590 A | 5/1999 | Hadley et al. |
| 5,914,973 A | 6/1999 | Jiang et al. |
| 5,917,848 A | 6/1999 | Claisse et al. |
| 5,943,359 A | 8/1999 | Ramdani et al. |
| 5,956,363 A | 9/1999 | Lebby et al. |
| 5,956,364 A | 9/1999 | Jiang et al. |
| 5,963,576 A | 10/1999 | Claisse et al. |
| 5,966,399 A | 10/1999 | Jiang et al. |
| 5,978,408 A | 11/1999 | Thornton |
| 5,985,686 A | 11/1999 | Jayaraman |
| 6,026,108 A | 2/2000 | Lim et al. |
| 6,118,799 A | 9/2000 | Okubo et al. |
| 6,160,834 A | 12/2000 | Scott |
| 6,169,757 B1 | 1/2001 | Merritt |
| 6,185,241 B1 | 2/2001 | Sun |
| 6,195,381 B1 | 2/2001 | Botez et al. |
| 6,252,894 B1 | 6/2001 | Sasanuma et al. |
| 6,256,330 B1 | 7/2001 | LaComb |

OTHER PUBLICATIONS

Kenichi Iga and Fumio Koyama, Surface Emitting Semiconductor Lasers and Arrays, Chapter 3, pp. 71–72, Vertical–Cavity Surface Emitting Laser and Arrays, Academic Press, Inc., 1993.

Tai, et al., 90% Coupling of Top Surface emitting GaAs/AlGaAs Quantum Well Laser Output into 8um Diameter Core Silica Fibre, Electronics Letters, vol. 26, No. 19, Sep. 13, 1990.

Tai, et al., Use of Implant Isolation for Fabrication of Vertical Cavity Surface–Emitting Laser Diodes, Electronic Letters, vol. 25, No. 24, Nov. 23, 1989.

Choquette, et al., GaAs Vertical–Cavity Surface Emitting Lasers Fabricated by Reactive Ion Etching, IEEE Photonics Technology Letters, vol. 3, No. 10, Oct. 1991.

Gourley, et al., Lasing Threshold in Quantum Well Surface–Emitting Lasers: Many–Body Effects and Temperature Dependence, Appl. Phys. Lett., vol. 55, No. 26, pp. 2698–2700, Dec. 25, 1989.

Eli Kapon, Semiconductor Lasers II—Materials and Structures, Academic Press, San Diego, California, pp 1–380, 1999.

Ghatak, et al., Introduction to Fiber Optics, Cambridge University Pres, Cambridge, UK, pp. 200–237, 1998.

Joseph T. Verdeyen, Laser Electronics—Third Edition, Prentice Hall, Englewood Cliffs, New Jersey, pp. 440–588, 1995.

Ray T. Chen, et al., Optoelectronic Interconnects and Packaging, SPIE Optical Engineering Press, Bellingham, Washington, pp. 3–34, Jan. 1996.

Donald O'Shea, et al., Introduction to Lasers and their Application, Addison–Wesley Publishing Company, Reading Massachusetts, pp. 156–167, Dec. 1978.

Geels, et al., Low Threshold Planarized Vertical–Cavity Surface–Emitting Lasers, IEEE Phototronics Technology Letters, vol. 2, No. 4, pp. 234–236, Apr. 4, 1990.

Richard C. Dorf, ED., The Electrical Engineering Handbook, Chapter 30: Optoelectronics, Hecht, et al. pp. 738–751, CRC Press, Boca Raton, Florida, 1993.

Ben G. Streetman, Solid State Electronic Devices, 3rd Edition, Prentice Hall, Englewood Cliffs, New Jersey, pp. 387–398.

Dan Botez & Don E. Scifres, Diode Laser Arrays, pp. 368–371.

L.W. Tu, Y.H. Wang, E.F. Schubert, B.E. Weir, G.J. Zydzik, A.Y. Cho, "High Temperature Performance of Three–Quantum–Well Vertical–Cavity Top–Emitting Lasers", Electronics Letters, pp. 457–458, V. 27 Feb. 28, 1991.

Y.H. Lee, B. Tell, K. Brown–Goebeler, J.L. Jewell, R.E. Leibenguth, M.T. Asom, G. Livescu, L. Luther & V.D. Mattera, High Efficiency (1–2mW/mA) Top–Surface–Emitting GaAs Quantum Well Lasers, Electronics Letters; pp. 1308–1310, vol. 26, Aug. 2, 1990.

Y.H. Lee, T. Tell, K. Brown–Goebeler, J.L. Jewell, C.A. Burrus & J.V. Hove, Characteristics of Top–Surface–Emitting GaAs Quantum–Well Lasers, IEEE Photonics Technology Letters, pp. 686–688, vol. 2, No. 9, Sep. 1990.

H. Uenohara, F. Koyama & K. Iga, AlGaAs/GaAs Multiquantum–Well (MQW) Surface–Emitting Laser, Electronics Letters, pp. 770–771, vol. 25, No. 12, Jun. 8, 1989.

F. Koyama, S. Kinoshita & K. Iga, Room–Temperature Continuous Wave Lasing Characteristics of A GaAs Vertical Cavity Surface–Emitting Laser, pp. 221–222; Appl. Phys. Lett. 55 (3) Jul. 17, 1989.

K. Choquette, G. Hasnain, Y.H. Wang, J.D. Wynn, R.S. Freund, A.Y. Cho & R.E. Leibenguth, GaAs Vertical–Cavity Surface Emitting Lasers Fabricated by Reactive Ion Etching, pp. 859–862, IEEE Photonics Technology Letters, vol. 3, No. 10, Oct. 1991.

K. Tai, R.J. Fischer, K.W. Wang, S.N.G. Chu & A.Y. Cho, Use of Implant Isolation for Fabrication of Vertical Cavity Surface–Emitting Laser Diodes, pp. 1644–1645, Electronics Letters, vol. 25, No. 24, Nov. 23, 1989.

P.R. Claisse, W. Jiang, P.A. Kiely, M. Roll, L. Boughter, P. Sanchez, D. Cotney, M. Lebby, B. Webb & B. Lawrence, Automatic Power Control of a VCSEL Using an Angled LID T056 Package, pp. 203–209, Electronic Components and Technology Conference, 1998.

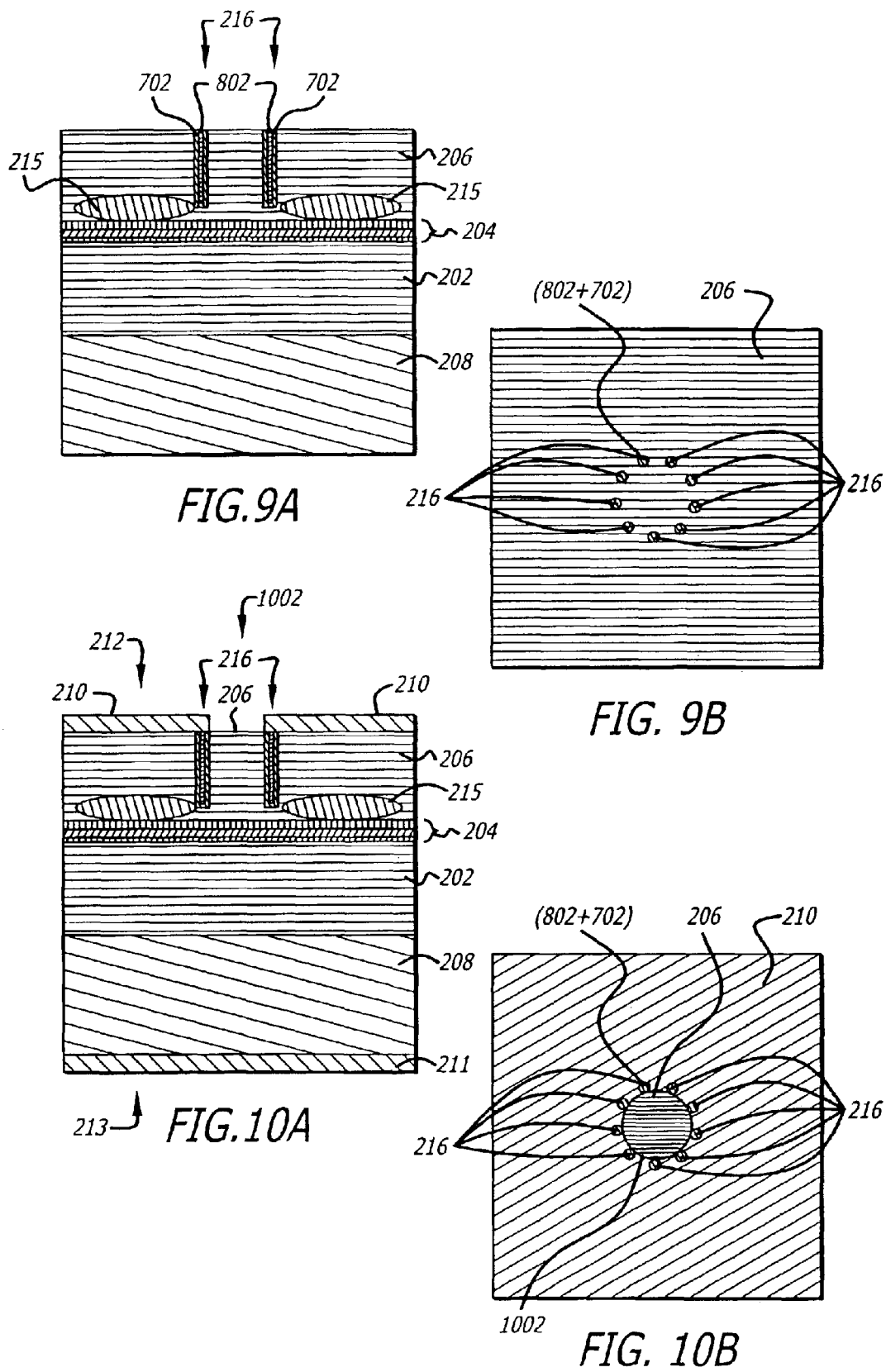

METHODS FOR FORMING INDEX GUIDED VERTICAL CAVITY SURFACE EMITTING LASERS

CROSS REFERENCE TO RELATED APPLICATIONS

This United States patent application claims the benefit and is a divisional application of U.S. patent application Ser. No. 09/400,359, filed Sep. 20, 1999 by Hsing-Chung Lee et al., now U.S. Pat. No. 6,577,658, both of which are to be assigned to E2O Communications, Inc.

FIELD OF THE INVENTION

The present invention relates generally to semiconductor lasers. More particularly, the present invention relates to vertical cavity surface emitting lasers (VCSELs).

BACKGROUND OF THE INVENTION

Semiconductor lasers have become more important. One of the more important applications of semiconductor lasers is in communication systems where fiber optic communication media is employed. With growth in electronic communication, communication speed has become more important in order to increase data bandwidth in electronic communication systems. Improved semiconductor lasers can play a vital roll in increasing data bandwidth in communication systems using fiber optic communication media.

The operation of basic semiconductor lasers is well known. Semiconductor lasers can be categorized as surface emitting or edge emitting depending upon where laser light is emitted. They may also be classified by the type of semiconductor junctions used such as heterojunction or homojunction Referring to FIG. 1A, a prior art vertical cavity surface emitting laser (VCSEL) 100 is illustrated. VCSEL 100 is cylindrical in shape and includes heterojunctions. When VCSEL 100 is lasing, the laser light is emitted from the top surface in a region defined by the optical confinement region 103. VCSEL 100 includes a first terminal 101 and a second terminal 102 coupled respectively to the top and bottom surfaces of the VCSEL to provide current and power. VCSEL 100 includes distributed Bragg reflector (DBR) layers 104A and 104B defining the optical confinement region 103. The optical confinement region 103 provides optical confinement such that the light can be reflected between the DBR layers 104A and 104B in a reinforcing manner to provide light amplification. VCSEL 100 includes heterojunction layers 105 which forms an active region 106 with the optical confinement region 103. The active region 106 provides current confinement so as to provide lasing when a threshold current is supplied to the VCSEL 100. Threshold current is the current level required for injecting enough carriers (electrons and holes) for lasing to occur. When lasing, the VCSEL 100 has a transverse mode field 108 and a longitudinal mode field 109. To improve optical confinement index guiding may be used. Index guiding uses layers of different compounds and structures to provide a real refractive index profile to waveguide the light. Alternatively a VCSEL may be gain guided. In gain guiding, the carriers induce a refractive index difference which is a function of the laser current level and output power.

There are three types of prior art VCSEL devices that are of interest. These are planar proton implanted VCSELs, ridge waveguide VCSELs (RWG) and oxide confined VCSELs. Referring now to FIG. 1B, a planar proton implanted VCSEL 110 is illustrated. Planar proton implanted VCSELs are relatively easy to fabricate and have a planar top surface that allows easy contact metalization and metal interconnect. As a result, a large contact area can be manufactured with low resistance. However, planar proton implanted VCSELs lack sufficient index refraction difference in the lateral direction to provide good optical confinement. Optical confinement of planar proton implanted VCSELs is generated by gain guiding and thermal lensing effect caused by heating. The thermal lensing effect (diverging/converging) provides a change in the index of refraction as a proportion of temperature due to the heating of the junctions. These methods of optical confinement provide poor performance and result in planar proton implanted VCSELs having a high threshold current, large turn-on delay and large timing jitter. The turn on delay and timing jitter of a VCSEL are functions of the threshold current. The lower the threshold current the easier it is to turn on a VCSEL and the less is the turn on delay time needed to generate the appropriate amount of current with the VCSEL for lasing. The higher the turn on threshold the greater is the timing jitter in turning on and off a VCSEL. The high threshold current additionally implies a higher operation current and thus a shorter lifetime in the operation of the planar proton implanted VCSEL. The planar proton implanted VCSEL having a large turn-on delay and a large timing jitter makes it unsuitable for high speed applications beyond 2.5 Gbps.

Referring now to FIG. 1C, an improvement over planar proton implanted VCSELs is the prior art ridge waveguide proton implanted VCSEL 120. Ridge waveguide VCSELs have stronger optical mode confinement provided by the large index refraction difference between semiconductor and air. This large index refraction is similar to what is provided by edge emitting semiconductor lasers. The ridge waveguide proton implanted VCSEL provides a lower threshold current than a planar proton implanted VCSEL and thus potentially longer operational lifetime. The thermal lensing effect is minimal in ridge waveguide proton implanted VCSELs, and thus have fast turn-on and turn-off times. The timing jitter in ridge waveguide proton implanted VCSELs is much smaller than that of planar VCSELs. The ridge waveguide proton implanted VCSELs can potentially operate up to 5 Gbps, beyond which, they are limited by an RC time constant—the resistance being that of the device. However, ridge waveguide VCSELS are difficult to manufacture because of their nonplanar surface. The top surface metalization of a ridge waveguide VSCEL is particularly difficult to manufacture. A disadvantage to ridge waveguide VCSELs is that the heat dissipation is poor resulting in a thermal resistance typically 50% greater than that of planar proton implanted VCSELs. Thermal resistance causes a temperature rise in the active region as a function of the dissipated power therein. Heat dissipation is a very important factor in improving semiconductor device reliability. Large device resistances result in large RC time constants, ultimately limiting the device from high speed applications.

Referring now to FIG. 1D and FIG. 1E, an improvement over ridge waveguide VCSELs is the prior art oxide confined VCSELs 130 and 140. Oxide confined VCSELs utilize a partially oxidized AlAs layer to provide current blocking for current confinement. Oxide confined VCSELs have lower threshold currents due to good current confinement and lower resistance that allows for high speed operation. Depending on where the oxidized current blocking layer is manufactured in an oxide confined VCSEL, optical confinement for the optical mode of the semiconductor laser can be provided by the index refraction difference between the oxidized portion of the AlAs layer and the non-oxidized portion of the AlAs layer. Typically, $Al_2O_3$ has an index of refraction of about 1.5 and AlAs has an index of refraction of 2.9. Disadvantages associated with the oxidized VCSEL technology are difficult manufacturability (i.e., low yield) and poor uniformity, consistency, and reliability. Generally, it is desirable to avoid oxidizing a material within a VSCEL because it creates lattice defects that will grow and eventually degrades VCSEL device performance. In addition, stresses caused by the volume change after material oxidation accelerates VCSEL device degradation.

BRIEF SUMMARY OF THE INVENTION

Briefly, the present invention includes a method, apparatus and system for planar index guided vertical cavity surface emitting lasers as described in the claims.

The apparatus and manufacture of a planar index guided vertical cavity surface emitting laser (VCSEL) is provided. Planar index guided vertical cavity surface emitting laser (PIG VCSEL) utilizes index guiding to provide improved optical confinement and proton implantation to improve current confinement. Index guiding is achieved by etching a plurality of index guide openings (holes, partial ridges or other shapes) into a p-DBR mirror around the desired optical confinement region. The index guiding may be adjusted by varying the etched volume and depth of index guide openings (holes, partial ridges, or other shapes). The degree of index guiding is achieved by controlling the etching profile and etching depth. The degree of current confinement is achieved by controlling the implant depth and the overlap between the implant portion and etching portion. Index guiding minimizes thermal lensing effects, and thus provides a smaller turn-on delay and a smaller timing jitter. The planar index guided (PIG) VCSELs provides good optical mode confinement and current confinement, and thus lower threshold current, allowing low power consumption and higher reliability. The top contact (p-metal) surface area is increased in the PIG VCSEL thereby lowering contact and device resistance to improve VCSEL performance further. Parasitic capacitance is also reduced by providing the increased top contact surface area to provide improved high speed operation. The PIG VCSEL is a planarized device having a planar top surface for ease of manufacture. The simple methods of manufacturing PIG VCSELs are disclosed herein.

BRIEF DESCRIPTIONS OF THE DRAWINGS

FIGS. 9A and 9B are cross sectional and top views respectively of contact etching manufacturing step for the planar index guided vertical cavity surface emitting laser of the present invention.

FIGS. 10A and 10B are cross sectional and top views respectively of the top and bottom contact deposition manufacturing step for the planar index guided vertical cavity surface emitting laser of the present invention.

DETAILED DESCRIPTION OF THE PREFERRED EMBODIMENT

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

A planar index guided vertical cavity surface emitting laser (PIG VCSEL) is provided by the present invention offering improved performance over prior art VCSELs in order to improve communication systems. The PIG VCSEL is substantially planar for ease of manufacturing and provides current confinement by proton implantation and optical confinement by etching holes or partial ridges within the VCSEL surrounding the optical confinement region for index guiding. The desired degree of index guiding is achieved by controlling the etching profile, volume and depth of the etching process for holes or partial ridges. The degree of current confinement is achieved by controlling the implantation depth of the protons and the overlap between the implantation region of the protons and the etched regions of the holes or partial ridges.

Figure 1A:
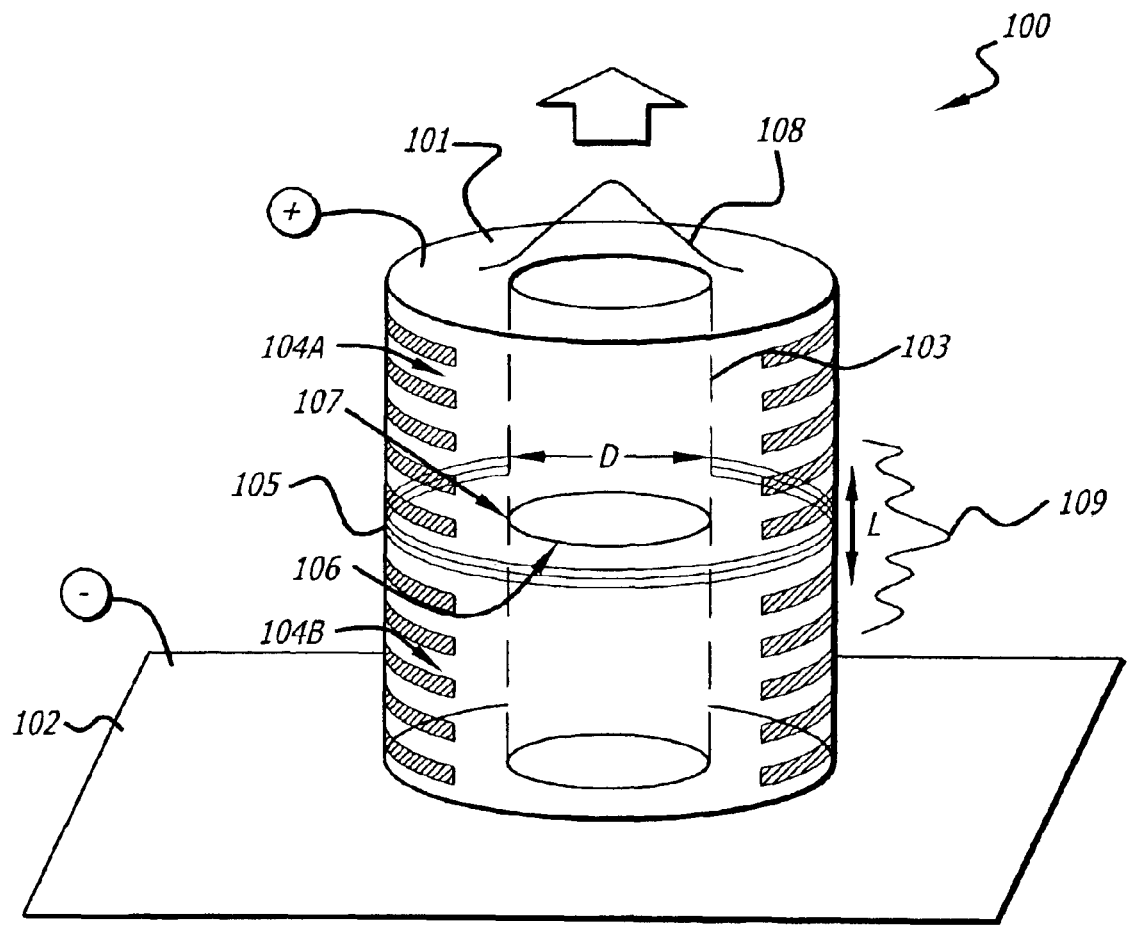
FIG. 1A is a three dimensional diagram of a prior art VCSEL structure.
Figure 1B:
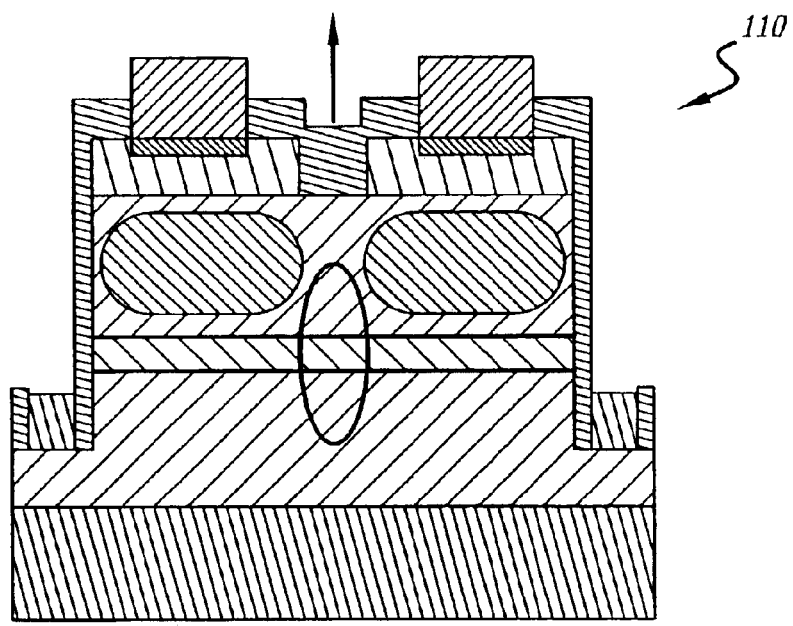
FIG. 1B is a cross sectional view of a prior art planar proton implanted VCSEL.
Figure 1C:
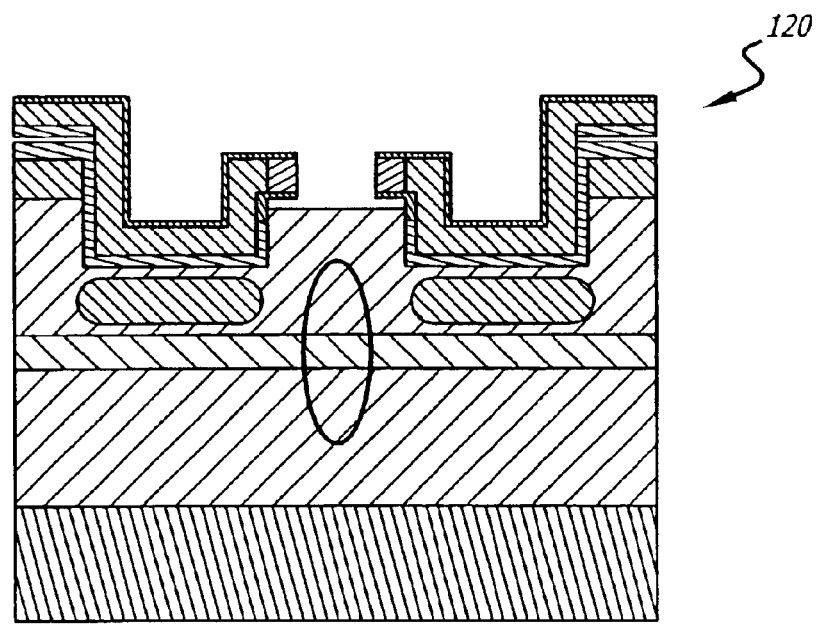
FIG. 1C is a cross sectional view of a prior art ridge waveguide proton implanted VCSEL.
Figure 1D:
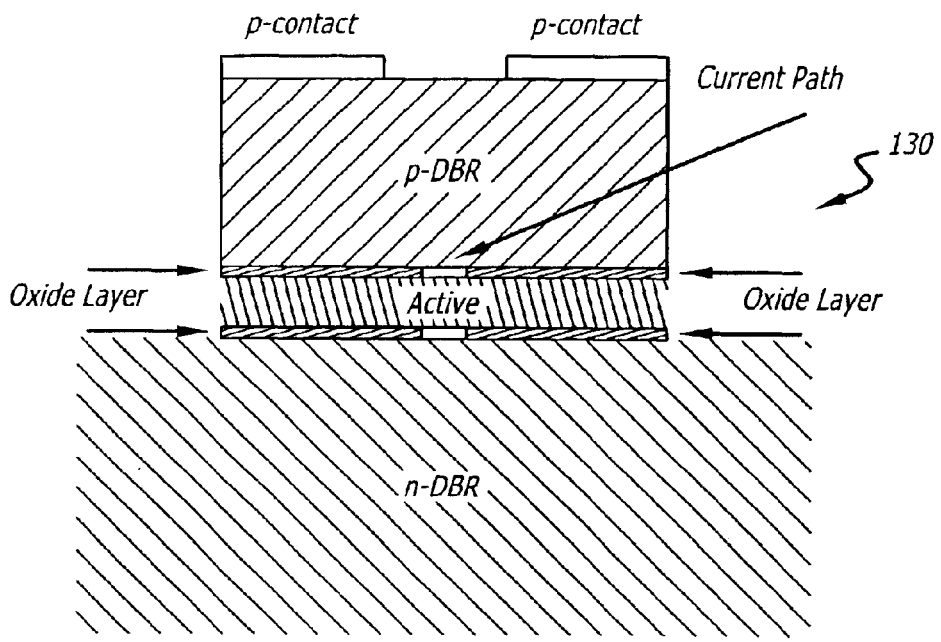
FIG. 1D is a cross sectional view of a prior art oxide confined VCSEL.
Figure 1E:
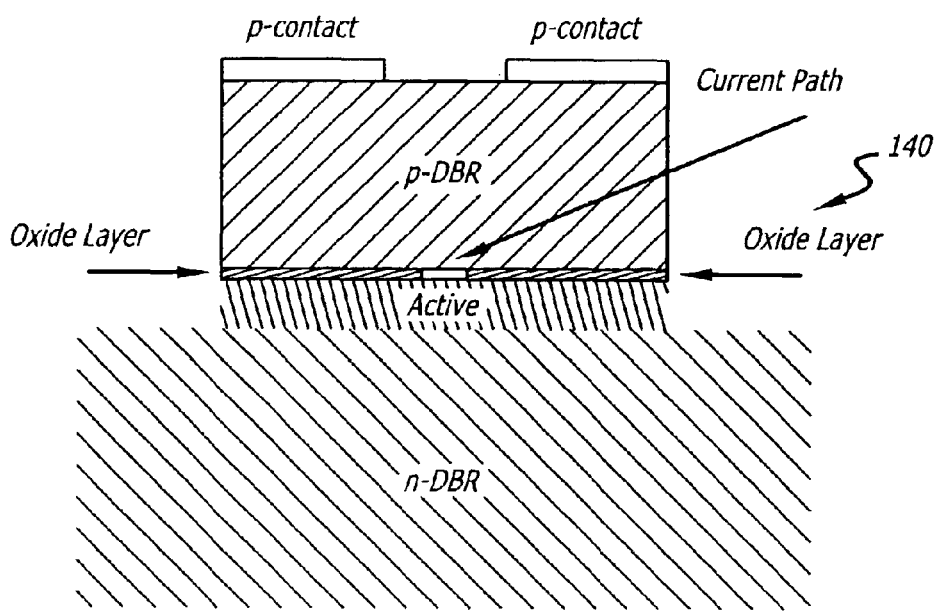
FIG. 1E is a cross sectional view of a second prior art oxide confined VCSEL.
Figure 2:
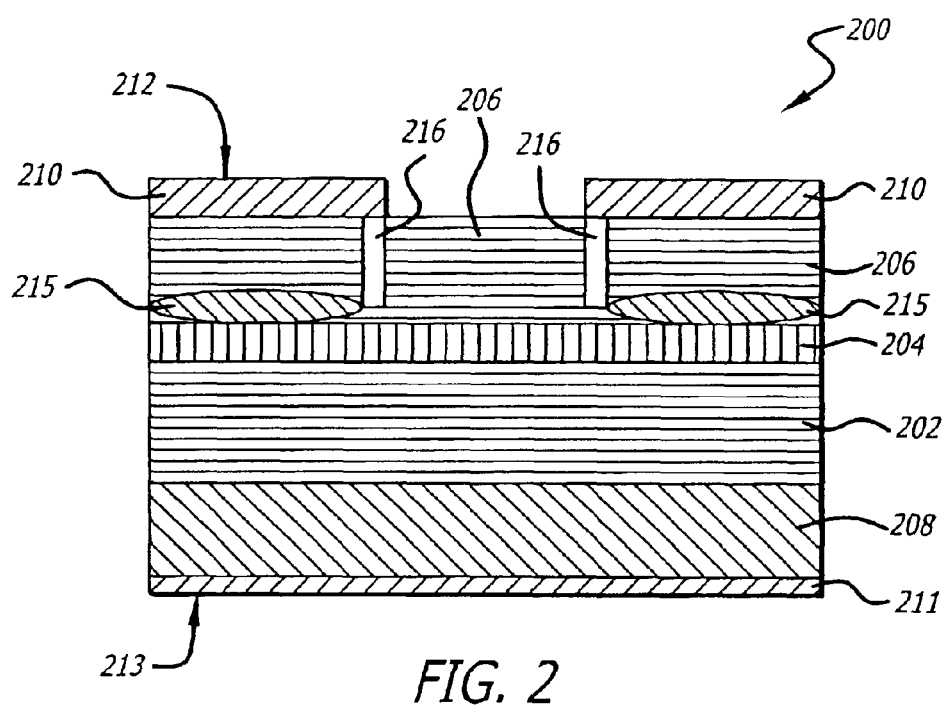
FIG. 2 is a cross sectional view of a planar index guided vertical cavity surface emitting laser according to the present invention.

Referring now to FIG. 2, a cross section of a PIG VCSEL 200 of the present invention is shown. The PIG VCSEL 200 is preferably formed in epi wafers. The PIG VCSEL 200 includes a bottom n-type distributed Bragg reflective mirror (n-DBR) 202, an active area 204 with quantum wells, and a top p-type distributed Bragg reflective (p-DBR) mirror 206. The substrate 208 of the epi wafers and thus the PIG VCSEL is GaAs. The substrate 208 is ndoped if contact terminals (p-metal) 210 and (n-metal) 211 are on top and bottom surfaces 212 and 213 respectively of the PIG VCSEL 200 as illustrated in FIG. 2 or the substrate 208 is semi-insulating if both contacts are made on the top surface. The bottom n-DBR mirror 202 is composed of $Al_xGa_{1-x}As/Al_yGa_{1-y}As$ doped with n-type dopants, such as Si, with the ratio of atoms indicated by subscript x being able to vary over the range of 0 to 0.5 and ratio of atoms indicated by subscript y being able to vary over the range of 0.5 to 1. Each $Al_xGa_{1-x}As$ and $Al_yGa_{1-y}As$ layer of the mirror 202 is preferably a quarter of a wavelength in thickness of the desired frequency of operation. For a frequency having a wavelength of 850 nanometers (nm) of the emitted laser light, it is desirable to have between twenty to fifty pairs of $Al_xGa_{1-x}As/Al_yGa_{1-y}As$ layers used for the n-DBR 202. A PIG VCSEL emitting a laser light having a desired wavelength of 780 nm can be achieved using a similar structure. The active region 204 is composed of cladding layers and active quantum wells. The cladding layers are composed of $Al_xGa_{1-x}As$ on both sides of the active quantum wells with subscript x being able to vary from 0.6 to 0.3. The cladding can be graded with x linearly changing from 0.6 at the interface with DBR mirrors 202 and 206 to 0.3 at the interface with the active quantum wells. The portion of the cladding close to the DBR mirrors 202 and 206 can also be doped with dopants similar to that used in the DBR mirrors 202 and 206. The active area 204 preferably has three to five quantum wells each composed of a GaAs quantum well and $Al_xGa_{1-x}As$ barriers. The GaAs quantum well thickness can vary from 6–12 nm, and the $Al_xGa_{1-x}As$ barrier thickness can vary from 6–12 nm. The x in the barriers varies from 0.2 to 0.4 and is typically 0.3. The active region 204 is preferably not doped with a dopant. The top p-DBR mirror 206 is composed of $Al_xGa_{1-x}As/Al_yGa_{1-y}As$ which is doped with p-type dopants such as C and Zn. For the top p-DBR mirror 206, x can vary from 0 to 0.5 and y vary from 0.5 to 1. Each $Al_xGa_{1-x}As$ and $Al_yGa_{1-y}As$ layer in the mirror 206 is preferably a quarter of a wavelength in thickness. Preferably the p-DBR mirror 206 has between 15 to 45 pairs of $Al_xGa_{1-x}As/Al_yGa_{1-y}As$ layers for the desired wavelength of laser light emission of around 850 nm. For a wavelength of 780 nm of laser light emission, a similar structure may also be used.

Figure 3:
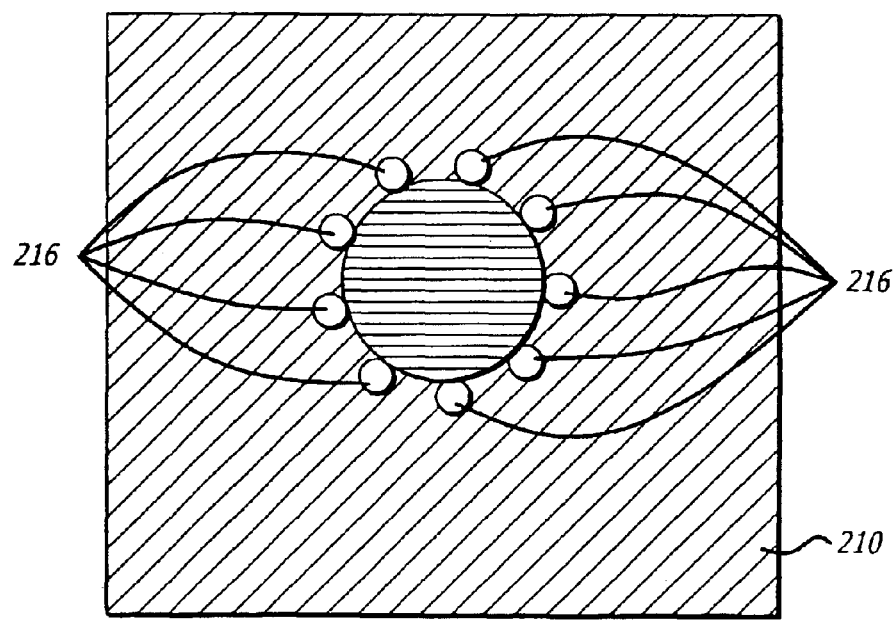
FIG. 3 is a top view of one embodiment of the planar index guided vertical cavity surface emitting laser according to the present invention.
Figure 4A:
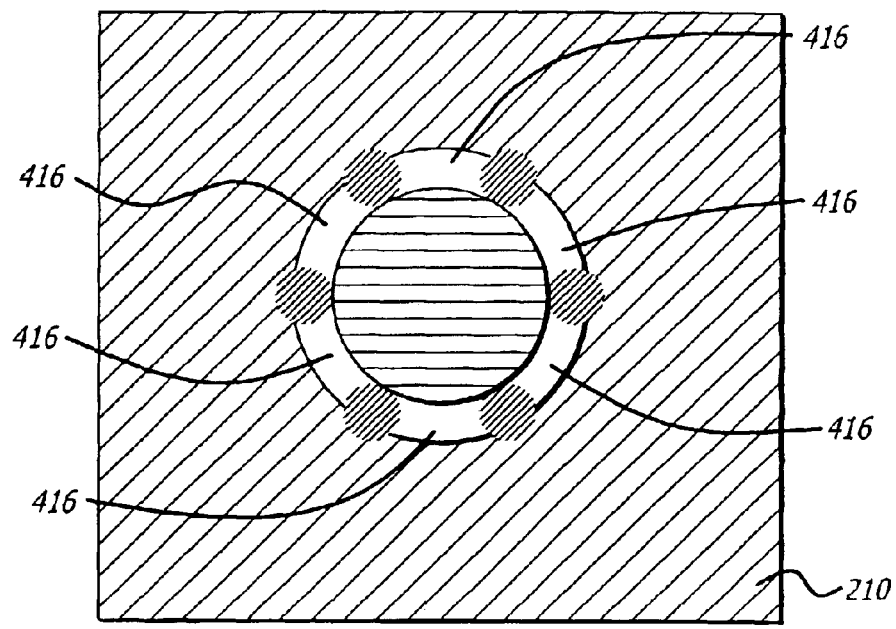
FIG. 4 is a top view of an alternative embodiment of a planar index guided vertical cavity surface emitting laser according to the present invention.

Current confinement in the PIG VCSEL 200 is provided by the implanted proton region 215. The implanted proton region 215 is implanted in a cylindrical fashion around the desired area of emission of laser light resulting in a washer shaped region having a varying thickness beneath the top surface 212 of the VCSEL 200. The thickness of the washer shaped implanted proton region 215 varies from a maximum at a midpoint between outer and inner cylindrical surfaces to minimums at each of the outer and inner cylindrical surfaces. Referring now to FIGS. 2 and 3, a plurality of index guide openings (holes 216) are etched in the VCSEL 200 to provide optical confinement through index guiding. The number of index guide openings (holes 216), as well as their etching profile and depth, control the desired degree of index guiding in the PIG VCSEL 200. The overlap between the proton implantation region 215 and the etched index guide openings (holes 216) also influences the current confinement of the PIG VCSEL 200. To alternatively provide optical confinement, a plurality of etched partial ridges or other shapes may be etched into the PIG VCSEL 200. FIG. 4A illustrates how partial ridges 416 are alternatively etched into the PIG VCSEL to provide optical confinement through index guiding. The partial ridges 416 are arc shaped regions etched into the p-DBR 206 surrounding the optical confinement region. A plurality of other etched shapes may be etched into the p-DBR 206 to surround and form the optical confinement region. The holes 216, partial ridges 416 and other etched shapes may be referred to as index guide openings, it being understood that holes 216 may be substituted for one the other etched shapes patterned and etched more that once into the p-DBR 206. The index guide openings (etched holes 216 or etched partial ridges 416) may be filled with a polyamide, an oxide growth or SiN to provide an alternate index of refraction as opposed to leaving them filled with a gas such as air and its respective index of refraction.

Figure 4B:
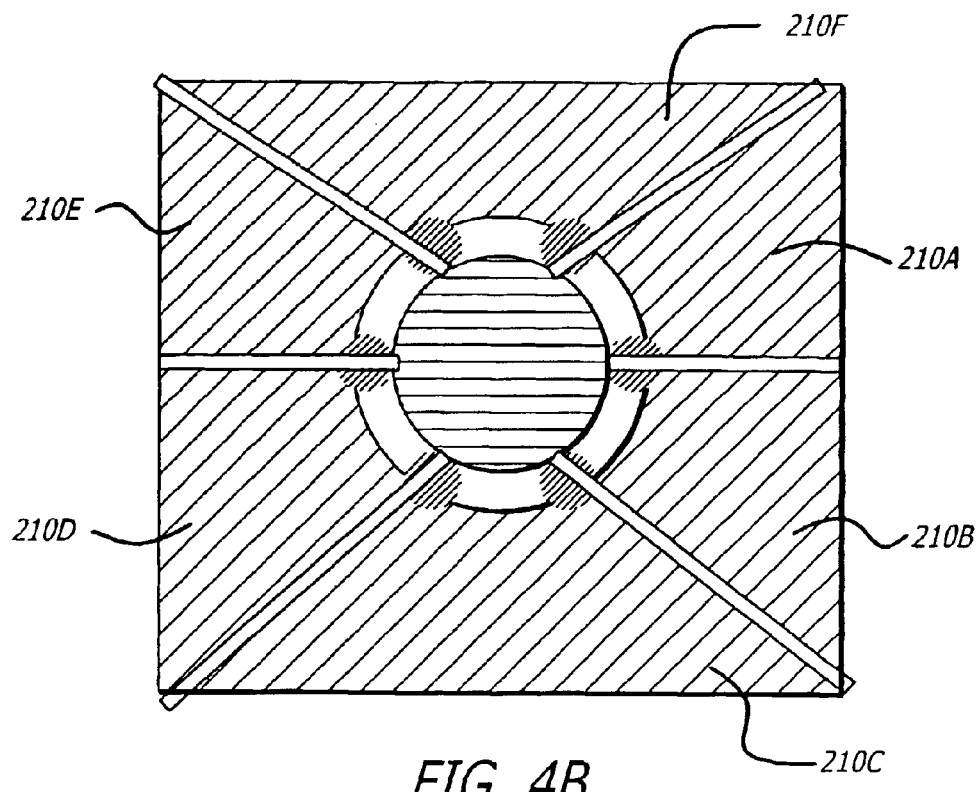

To provide further control over the current confinement for the PIG VCSEL, the top surface terminal (p-metal) 210 may be split up into multiple terminals such as illustrated by the multiple terminal regions 210A–210F in FIG. 4B. In this manner, each terminal region 210A–210F may be separately modulated to provide the desired amount of current confinement for the PIG VCSEL.

Figure 5A:
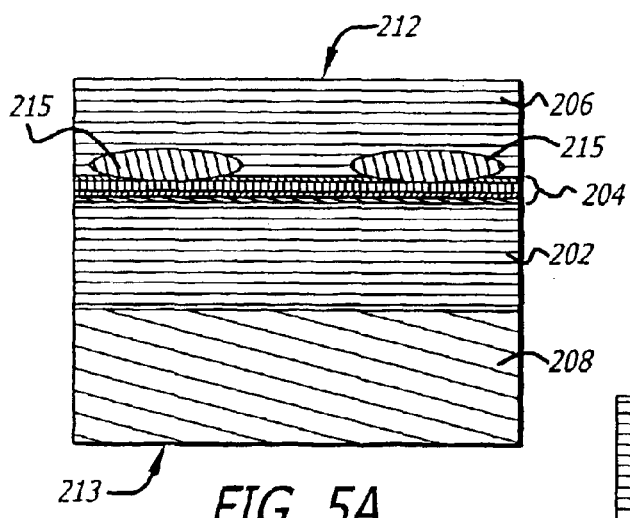
FIGS. 5A and 5B are cross sectional and top views respectively of the proton implantation manufacturing step for the planar index guided vertical cavity surface emitting laser of the present invention.
Figure 5B:
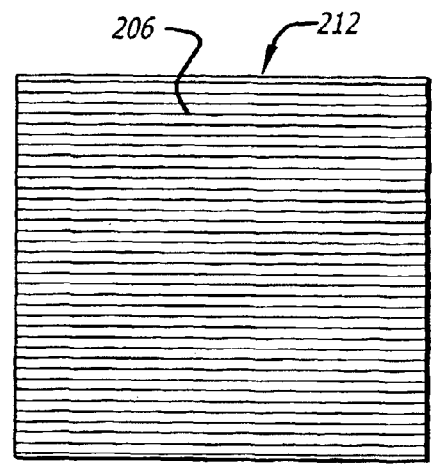

Fabrication of the PIG VCSEL 200 is now described with reference to FIG. 5A through FIG. 10B. For ease of understanding, FIGS. 5A through 10B illustrate the manufacturing of a single PIG VCSEL with the understanding that multiple PIG VCSEL devices are manufactured over a wafer at the same time. After forming an epitaxial wafer with n-DBR 202, active area 204, and p-DBR 206 in the GaAs substrate 208, atoms providing protons are implanted through a washer shaped region using a mask and photolithograpic techniques. This forms the proton region 215 in the PIG VCSEL 200 as illustrated in FIG. 5A. The proton region 215 surrounds the desired area of current confinement in the PIG VCSEL 200. Ionized Hydrogen are the protons that are implanted during the proton implantation step which is implanted into the proton region 215. Because of the desired depth of the proton region 215, an implant energy between 300 to 400 KeV is typically used to implant the proton atoms deep in the PIG VCSEL to the desired depth of the proton region 215 just above the active region 204. FIG. 5B shows little indication that proton implantation has occurred through the top surface 212 of the PIG VCSEL.

Figure 6A:
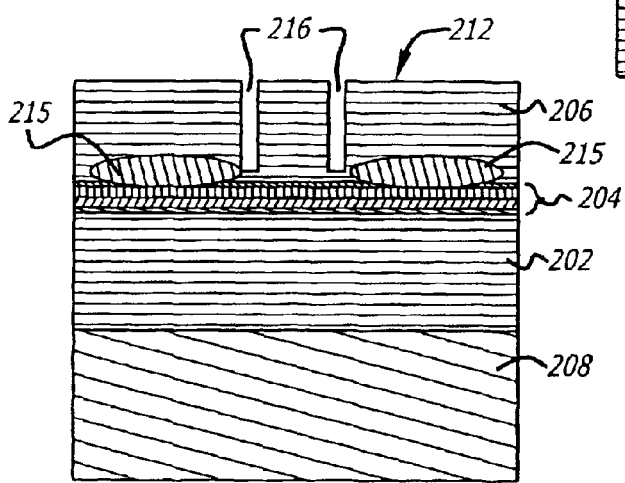
FIGS. 6A and 6B are cross sectional and top views respectively of the etching manufacturing step for the planar index guided vertical cavity surface emitting laser of the present invention.
Figure 6B:
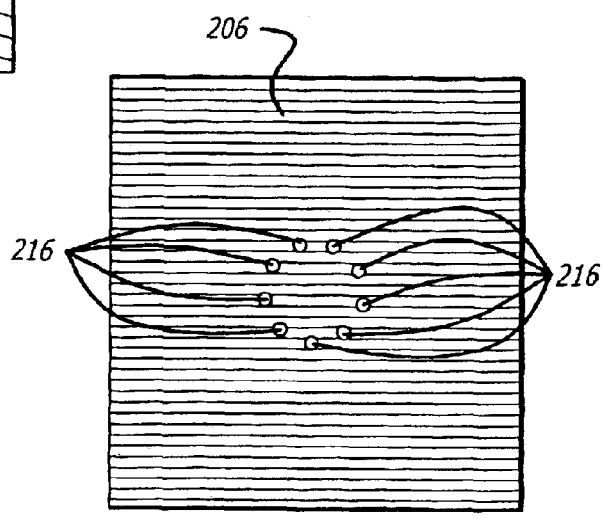

Referring now to FIGS. 6A and 6B, the holes 216 or partial ridges 416, or other etched shapes (collectively referred to as index guided openings) are next etched through the top surface of the wafer after a mask and photoligraphic techniques are used to define the etch areas on the top surface 212. For the purposes of illustration, holes 216 are illustrated as being etched into the wafer it being understood that partial ridges 416 having an arc shaped appearance around the desired area of the optical confinement region or other shapes may be etched instead of holes 216. The index guide openings (holes 216 or partial ridges 416) define the optical confinement region and a light emission aperture in the top surface 212 of the PIG VCSEL 200. The depth of the index guide openings (holes 216 or ridges 416) etched into the p-DBR 206 is down to about several $Al_xGa_{1-x}As/Al_yGa_{1-y}As$ mirror pair layers in the p-DBR 206 above the active area 204. To accurately control the etch profile of the index guide openings (holes 216 or ridges 416) and their depth, dry etch techniques such as reactive ion etching (RIE) are preferably used over wet etch techniques.

The etched regions introduce index guiding to the optical mode that transmits through the p-DBR. Because there is a difference in the indexes of refraction between the p-DBR materials and air or SiN or polyamide, photons are reflected back into the optical confinement region to further stimulate photon emission. The level of effective index guiding is adjustable by varying the volume of etched regions. Index guiding allows better optical mode confinement and thus lowers the threshold current requirement thereby minimizing the thermal turn-on delay and timing jitter.

Figure 7A:
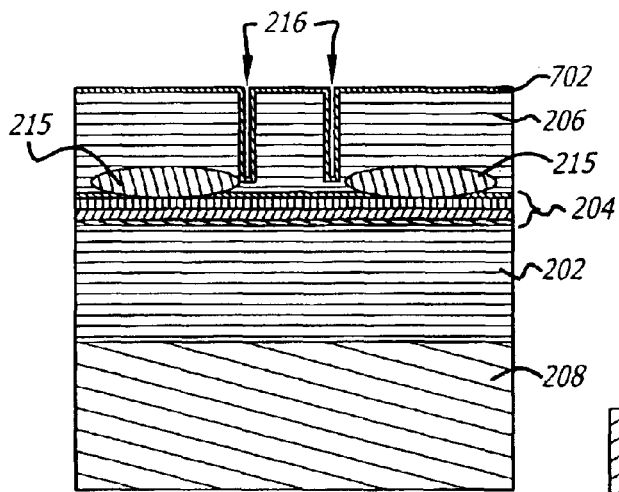
FIGS. 7A and 7B are cross sectional and top views respectively of the deposition of $SiN_x$ manufacturing step for the planar index guided vertical cavity surface emitting laser of the present invention.
Figure 7B:
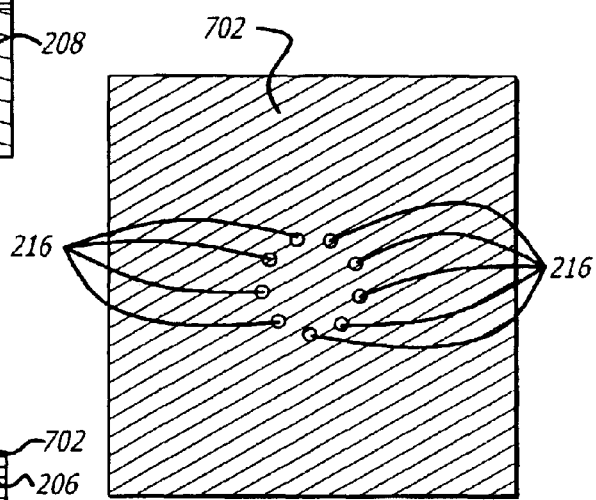

Referring now to FIGS. 7A and 7B, a layer of $SiN_x$ 702 (where x is a variable) is deposited on the top surface 212 across the wafer to provide an electrical insulation to the side walls and bottom surfaces of the index guide openings (holes 216 or ridges 416). The electrical insulation provided in this manner is also referred to as providing electrical isolation. The SiN$_x$ 702 material may be a silicon nitride, a silicon oxy nitride or other similar material. FIG. 7B illustrates the layer of SiN$_x$ 702 coating the top surface 212 and the surfaces of the index guide openings (holes 216).

Figure 8A:
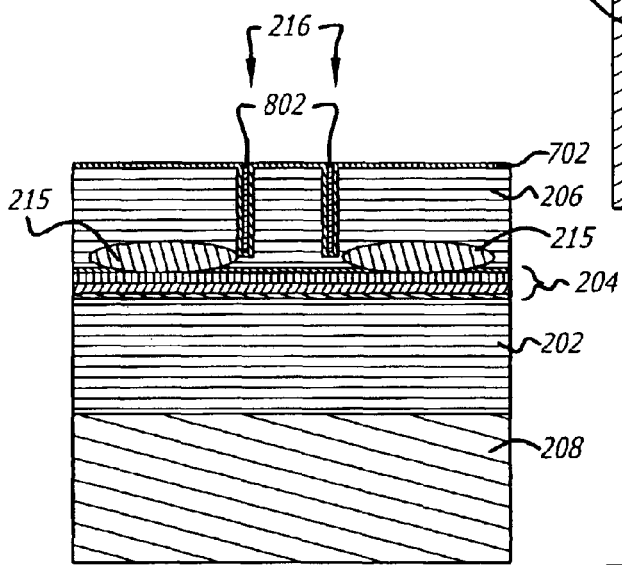
FIGS. 8A and 8B are cross sectional and top views respectively of the optional polyamide manufacturing step for the planar index guided vertical cavity surface emitting laser of the present invention.
Figure 8B:
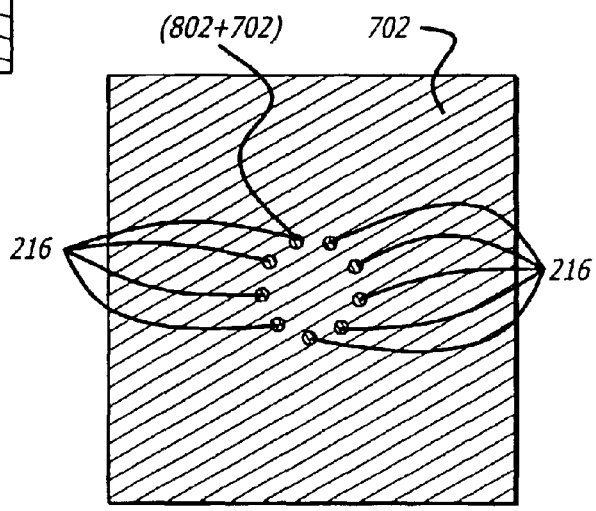

Referring now to FIGS. 8A and 8B, the remaining open volume of the index guide openings (holes 216 or partial ridges 426) can optionally be filled with a polyamide 802 to planarize the PIG VCSEL device. Alternatively, the remaining open volume may be left open to the air to provide an appropriate index of refraction to optically confine photons to the optical confinement region. If filled with polyamide, both the polyamide 802 and the SiN$_x$ 702 are within the index guide openings (holes 216) as illustrated in FIG. 8B by the reference designator (802+702).

Referring now to FIGS. 9A and 9B, the SiN$_x$ 702 on top of top surface of the p-DBR 206 is etched away so that the top contact terminal of the PIG VCSEL may be formed. The polyamide 802 filling the open volume and the SiN$_x$ 702 lining the surfaces of the holes 216 or ridges 416 remains therein after the etching step. FIG. 9B illustrates the contact surface area available on top of the p-DBR 206.

Referring now to FIGS. 10A and 10B, the top and bottom contact terminals of the PIG VCSEL are formed next. The top contact terminal (the p-metal) 210 is patterned such that the area of the optical confinement region at the surface of the p-DBR 206, the emission aperture 1002, is not covered by metal such that photons may be emitted out therefrom. FIG. 10B more clearly indicates the top contact terminal 210 surrounding the emission aperture 1002. The top contact terminal 210 may optionally cover the index guide openings (holes 216 or ridges 416). The PIG VCSEL structure allows for a greater surface area for the top contact (p-metal) terminal 210. A majority of VCSEL device resistance may be attributed to the top contact terminal 210 to the p-DBR 206 and the p-DBR 206 itself. By providing a larger surface area for the top contact terminal 210, the PIG VCSEL device resistance is reduced. As a result, the PIG VCSEL device has a lower RC time constant which translates into higher frequency of operation and greater data bandwidth. With a lower device resistance, there is less heat generated and better thermal dissipation which reduces thermal resistance and improves the PIC VCSEL's device reliability. The top contact terminal 210 may be deposited by lift-off or other metalization deposition techniques. The bottom contact terminal (the n-metal) 211 is similarly deposited to coat the bottom surface of the substrate 208 of the epi wafer. The p-metal used for the top contact terminal 210 is typically Ti:W/Au, Ti:Au/Au, Cr/ZnAu/Au, etc. The n-metal used for the bottom contact terminal 211 is typically Ni/GeAu/Au. A SiN passivation layer may be optionally grown in the emission aperture 1002 so as to protect the top surface of the p-DBR from damage. The thickness of the passivation layer can be anti-reflective to the emission wavelength. Upon completion of the top and bottom contact terminals 210 and 211, the PIG VCSEL device may be tested.

An advantage to the present invention is that it provides index guiding to provide improved optical mode confinement which in turn lowers the threshold current necessary for lasing and provides a minimal thermal turn-on delay and minimal timing jitter. The degree of index guiding may easily be modified by varying the amount of etched area of the index guide openings (holes or partial ridges). Another advantage to the present invention is that greater surface area of the top contact terminal (p-metal) is provided thereby lowering the contact resistance and the overall resistance of the VCSEL device. With a lower VCSEL device resistance (R), the RC time constant is lower which allows for greater frequency in operation, there is lower heat generated and better thermal dissipation reducing the thermal resistance and improving device reliability. Another advantage is that the present invention can be planarized so that it may be easily packaged into a laser diode package or directly integrated into a photodetector.

The preferred embodiments of the present invention are thus described. While the present invention has been described in particular embodiments, the present invention should not be construed as limited by such embodiments, but rather construed according to the claims that follow below.

What is claimed is:

1. A method of fabricating a planar index guided vertical cavity surface emitting laser, the method comprising:
   providing layers of a substrate, an n-DBR mirror coupled to the substrate, an active area having quantum wells coupled to the n-DBR mirror, and a p-DBR mirror coupled to the active area;
   implanting a cylindrical pattern of protons into the p-DBR mirror to a depth near the active area to form an implanted proton region in the p-DBR mirror;
   etching a pattern of index guide openings in the p-DBR mirror to form an optical confinement region;
   depositing an electrically insulating material into the etched pattern of index guide openings;
   depositing a first metalization in a top contact pattern on a surface of the p-DBR to form a first contact terminal and provide a low resistive contact and allow emission of photons from the optical confinement region; and,
   depositing a second metalization on a surface of the substrate to form a second contact terminal.

2. The method of claim 1 of fabricating a planar index guided vertical cavity surface emitting laser wherein, the etched pattern of index guide openings are holes in the p-DBR mirror.

3. The method of claim 1 of fabricating a planar index guided vertical cavity surface emitting laser wherein, the etched pattern of index guide openings are arc shaped open regions in the p-DBR mirror.

4. The method of claim 1 of fabricating a planar index guided vertical cavity surface emitting laser wherein, etching of the pattern of index guide openings is by a dry etch technique such as reactive ion etching to control the profile and depth of the index guide openings.

5. The method of claim 1 of fabricating a planar index guided vertical cavity surface emitting laser wherein, the depositing of electrically insulating material into the etched pattern of index guide openings includes depositing the electrically insulating material over the surface of the p-DBR and into the index guide openings and removing the electrically insulating material on a top surface of the p-DBR.

6. The method of claim 1 of fabricating a planar index guided vertical cavity surface emitting laser wherein, the protons are implanted to form the implanted proton region using an implantation energy between 300 to 400 KeV.

7. The method of claim 1 of fabricating a planar index guided vertical cavity surface emitting laser wherein, the deposited electrically insulating material is SiN$_x$ where x is a variable.

8. The method of claim 1 of fabricating a planar index guided vertical cavity surface emitting laser further comprising:
   depositing a polyamide into the index guide openings to fill and substantially planarize the p-DBR mirror and provide a differing index of refraction from air.

9. The method of claim 1 of fabricating a planar index guided vertical cavity surface emitting laser further comprising:

depositing a dielectric into the index guide openings to fill and substantially planarize the p-DBR mirror and isolate by providing a differing index of refraction from air.

10. The method of claim 9 of fabricating a planar index guided vertical cavity surface emitting laser wherein,
the dielectric is one of the set of silicon nitride (SiN), silicon oxy nitride (SiON), and silicon dioxide ($SiO_2$).

11. The method of claim 1 of fabricating a planar index guided vertical cavity surface emitting laser wherein,
the first metalization deposited for the first contact terminal is one of the materials of the set of Ti:W/Au, Ti:Au/Au, and Cr/ZnAu/Au.

12. The method of claim 1 of fabricating a planar index guided vertical cavity surface emitting laser wherein,
the second metalization deposited for the second contact terminal is Ni/GeAu/Au.

13. The method of claim 1 of fabricating a planar index guided vertical cavity surface emitting laser wherein,
the substrate layer provided is gallium arsenide (GaAs) and includes one of the materials of the set of p-type dopant, n-type dopant and semi-insulating material.

14. A method of forming an index guided vertical cavity surface emitting laser, the method comprising:
providing a substrate, a first distributed Bragg reflective (DBR) mirror coupled to the substrate, an active region over the first DBR mirror, the active region having one or more quantum wells, and a second DBR mirror over the active region;
etching a pattern of index guide openings in the second DBR mirror to form an optical confinement region;
implanting ions into the second DBR mirror to a depth near the active region to form an ion implanted region in the second DBR mirror;
depositing an electrically insulating material into the etched pattern of index guide openings;
depositing a first metalization in a top contact pattern on a surface of the second DBR to form a first contact terminal and provide a low resistive contact and allow emission of photons from the optical confinement region; and,
depositing a second metalization on a surface of the substrate to form a second contact terminal.

15. The method of claim 14 wherein, the first DBR mirror is an n-DBR mirror, and the second DBR mirror is a p-DBR mirror.

16. The method of claim 5 wherein, the ions implanted into the second DBR mirror are protons and the ion implanted region is an implanted proton region.

17. The method of claim 14 further comprising:
depositing a dielectric or a polyamide into the index guide openings to planarize the second DBR mirror and provide a differing index of refraction from air.

18. The method of claim 14 wherein,
the second DBR mirror includes a first Aluminum-Gallium-Arsenide ($Al_yGa_{1-y}As$) layer near the active region with y ranging from 0.95 to 1, and
the method further includes
prior to implanting the ions into the second DBR mirror, oxidizing a portion of the first Aluminum-Gallium-Arsenide ($Al_yGa_{1-y}As$) layer of the second DBR mirror to provide current blocking for current confinement.

19. The method of claim 18 wherein, the first DBR mirror includes a second Aluminum-Gallium-Arsenide ($Al_zGa_{1-z}As$) layer near the active region with z ranging from 0.95 to 1, and
the method further includes
prior to implanting the ions into the second DBR mirror, oxidizing a portion of the second Aluminum-Gallium-Arsenide ($Al_zGa_{1-z}As$) layer of the first DBR mirror to provide current blocking for current confinement.

20. A method of forming a vertical cavity surface emitting laser, the method comprising:
providing a substrate, an n-type distributed Bragg reflective (n-DBR) mirror over the substrate, an active region over the n-DBR mirror, the active region having one or more quantum wells, and a p-type distributed Bragg reflective (p-DBR) mirror over the active region, the p-DBR mirror having a first Aluminum-Gallium-Arsenide ($Al_yGa_{1-y}As$) layer near the active region with y ranging from 0.95 to 1;
etching a pattern of index guide openings in the p-DBR mirror to form an optical confinement region;
oxidizing a portion of the first Aluminum-Gallium-Arsenide ($Al_yGa_{1-y}As$) layer of the p-DBR mirror to provide current blocking for current confinement;
implanting protons in a pattern into the p-DBR mirror to a depth near the active area to form an implanted proton region in the p-DBR mirror;
depositing an electrically insulating material into the etched pattern of index guide openings;
forming a first contact terminal on a surface of the p-DBR mirror to provide a low resistive contact and allow emission of photons from the optical confinement region; and,
forming a second contract terminal on a surface of the substrate.

21. The method of claim 20 wherein,
the etched pattern of index guide openings are holes in the p-DBR mirror.

22. The method of claim 20 wherein,
the etched pattern of index guide openings are arc shaped open regions in the p-DBR mirror.

23. The method of claim 20 wherein,
the etching of the pattern of index guide openings is by dry etching to control the profile and depth of the index guide openings.

24. The method of claim 20 wherein,
the degree of index guiding is achieved by controlling the etching profile, volume, and depth of the etching of the pattern of index guide openings.

25. The method of claim 20 further comprising:
depositing a dielectric or a polyamide into the index guide openings to planarize the p-DBR mirror and provide a differing index of refraction from air.

26. The method of claim 20 wherein,
the substrate is gallium arsenide (GaAs).

27. The method of claim 20 wherein,
the n-DBR mirror includes a second Aluminum-Gallium-Arsenide ($Al_zGa_{1-z}As$) layer near the active region with z ranging from 0.95 to 1, and
the method further includes
prior to implanting the protons, oxidizing a portion of the second Aluminum-Gallium-Arsenide ($Al_zGa_{1-z}As$) layer of the n-DBR mirror to provide current blocking for current confinement.

28. The method of claim 20 wherein,
the first contact terminal has multiple terminal regions that may be separately modulated to control the desired amount of current confinement.

* * * * *

UNITED STATES PATENT AND TRADEMARK OFFICE
CERTIFICATE OF CORRECTION

PATENT NO.   : 6,852,558 B2
DATED        : February 8, 2005
INVENTOR(S)  : Lee et al.

It is certified that error appears in the above-identified patent and that said Letters Patent is hereby corrected as shown below:

Column 9,
Line 47, "claim 5 wherein" should read -- claim 15 wherein --.

Signed and Sealed this

First Day of November, 2005

JON W. DUDAS
*Director of the United States Patent and Trademark Office*